United States Patent
Mori

(10) Patent No.: US 9,496,478 B2
(45) Date of Patent: Nov. 15, 2016

(54) METHOD OF DAMPING ACTUATOR WITH TRANSLATION MECHANISM AND ACTUATOR

(71) Applicant: Akita Prefecture, Akita-shi, Akita (JP)

(72) Inventor: Shigeki Mori, Akita (JP)

(73) Assignee: Akita Prefecture, Akita-Shi (JP)

( * ) Notice: Subject to any disclaimer, the term of this patent is extended or adjusted under 35 U.S.C. 154(b) by 366 days.

(21) Appl. No.: 14/162,562

(22) Filed: Jan. 23, 2014

(65) Prior Publication Data
US 2014/0210312 A1  Jul. 31, 2014

(30) Foreign Application Priority Data

Jan. 25, 2013 (JP) .................. 2013-011990

(51) Int. Cl.
| | |
|---|---|
| H01L 41/09 | (2006.01) |
| H01L 41/083 | (2006.01) |
| H01L 41/053 | (2006.01) |
| H02N 2/04 | (2006.01) |

(52) U.S. Cl.
CPC .............. *H01L 41/053* (2013.01); *H02N 2/04* (2013.01); *H01L 41/083* (2013.01)

(58) Field of Classification Search
USPC ................................. 310/311–371
See application file for complete search history.

(56) References Cited

U.S. PATENT DOCUMENTS

| | | | | |
|---|---|---|---|---|
| 4,416,349 A * | 11/1983 | Jacobs | ................. | G10K 11/16 181/208 |
| 4,425,980 A * | 1/1984 | Miles | ................ | B64C 1/40 181/208 |
| 4,859,523 A * | 8/1989 | Endoh | .................... | B32B 15/08 428/215 |
| 5,315,203 A * | 5/1994 | Bicos | .................. | F16F 15/005 310/326 |
| 5,838,092 A * | 11/1998 | Wang | ..................... | H01L 41/08 310/326 |
| 5,955,823 A * | 9/1999 | Nilsson | ................. | A61B 8/546 310/344 |
| 6,134,113 A * | 10/2000 | Mills | ...................... | F16F 15/08 248/638 |
| 6,333,587 B1 * | 12/2001 | Heinz | ................. | F02M 51/005 310/328 |
| 6,924,586 B2 * | 8/2005 | Moler | .................. | F04B 17/003 310/328 |
| 7,219,410 B2 * | 5/2007 | Olczak | .................... | B23Q 1/34 29/33 P |
| 7,332,848 B2 | 2/2008 | Mori | | |

(Continued)

FOREIGN PATENT DOCUMENTS

JP         3612670 B1     11/2004

OTHER PUBLICATIONS

"4.13 Parallel Pre-Stressed Actuators PPA M Series," and "4.14 Parallel Pre-Stressed Actuators PPA L Series," Cedrat Technologies Piezo Products Catalog, Version 4.0, 2012-2013, pp. 66-67.

(Continued)

*Primary Examiner* — Thomas Dougherty
(74) *Attorney, Agent, or Firm* — Christensen O'Connor Johnson Kindness PLLC

(57) ABSTRACT

According to one embodiment, a method of damping an actuator to reduce an amplitude of a resonance peak of the actuator, including a piezoelectric element and a translation mechanism, includes securing one surface of a restraint member having at least two surfaces to a movable part of the translation mechanism with an elastic or viscoelastic body therebetween, securing the other surface of the restraint member to a support portion of the translation mechanism with an elastic or viscoelastic body therebetween, and converting vibration energy of the movable part into thermal energy, based on distortion caused by deformation of the elastic or viscoelastic body.

14 Claims, 10 Drawing Sheets

(56) References Cited

U.S. PATENT DOCUMENTS

| | | | | |
|---|---|---|---|---|
| 7,427,744 | B2* | 9/2008 | Watanabe | B82Y 35/00 250/216 |
| 2002/0038988 | A1* | 4/2002 | Matsuo | H02N 2/103 310/323.16 |
| 2008/0026245 | A1* | 1/2008 | Saga | B32B 15/08 428/626 |
| 2009/0195123 | A1* | 8/2009 | Murata | G10K 9/122 310/326 |
| 2010/0245966 | A1* | 9/2010 | Yasuda | H01L 41/0953 359/224.1 |

OTHER PUBLICATIONS

"IKO Piezo Stage SP," IKO Nippon Thompson Internet Catalog, © 2012 Nippon Thompson Co., Ltd., <http://www.ikont.co.jp/eg/product/mecha/mch21.html> [retrieved Jan. 21, 2014], 2 pages.

"Multilayer Piezoelectric Actuators," NEC/TOKIN Internet Catalog, vol. 06, Apr. 8, 2011, 27 pages (Japanese version); "Multilayer Piezoelectric Actuators," NEC/TOKIN Internet Catalog, vol. 07, Mar. 13, 2013, 27 pages (English version).

"Nanopositioning/Piezoelectrics: Piezo Systems, Fast Piezo Steering Mirrors," Product Information from Catalog 120E, Physik Instruments (PI) GmbH & Co. KG, Aug. 2008, pp. 2-2-2-98.

"Piezo Actuators & Components: For Motion Control, Sensing, Energy Harvesting," Product Information from Catalog 120E, Physik Instruments (PI) GmbH & Co. KG, Aug. 2008, pp. 1-62-1-107.

"Piezoelectrics in Positioning," Product Information from Catalog 120E, Physik Instruments (PI) GmbH & Co. KG, Aug. 2008, pp. 2-172-2-217.

"Piezo Nano Positioning: Inspirations 2009," Product Information from Catalog 120E, Physik Instruments (PI) GmbH & Co. KG, Aug. 2008, pp. 1-74-1.75, 2-16-2-19.

* cited by examiner (A5052 [1.14 g] for restraint member)
(Note) The gain is a difference from 10 Hz (SUS303 [1.92 g] for restraint member)
(Note) The gain is a difference from 10 Hz (SUS303 [3.92 g] for restraint member)
(Note) The gain is a difference from 10 Hz Comparison of amplitudes of main resonance points

|  | No damper | Aluminum damper 1.14g | Stainless-steel damper 1 1.92g | Stainless-steel damper 2 3.32g |
|---|---|---|---|---|
| 13.9kHz | 15.9dB | 5.1dB | 2.6dB | 2.7dB |
| 9.9kHz | 3.8dB | 0.3dB | -0.6dB | 0.5dB |

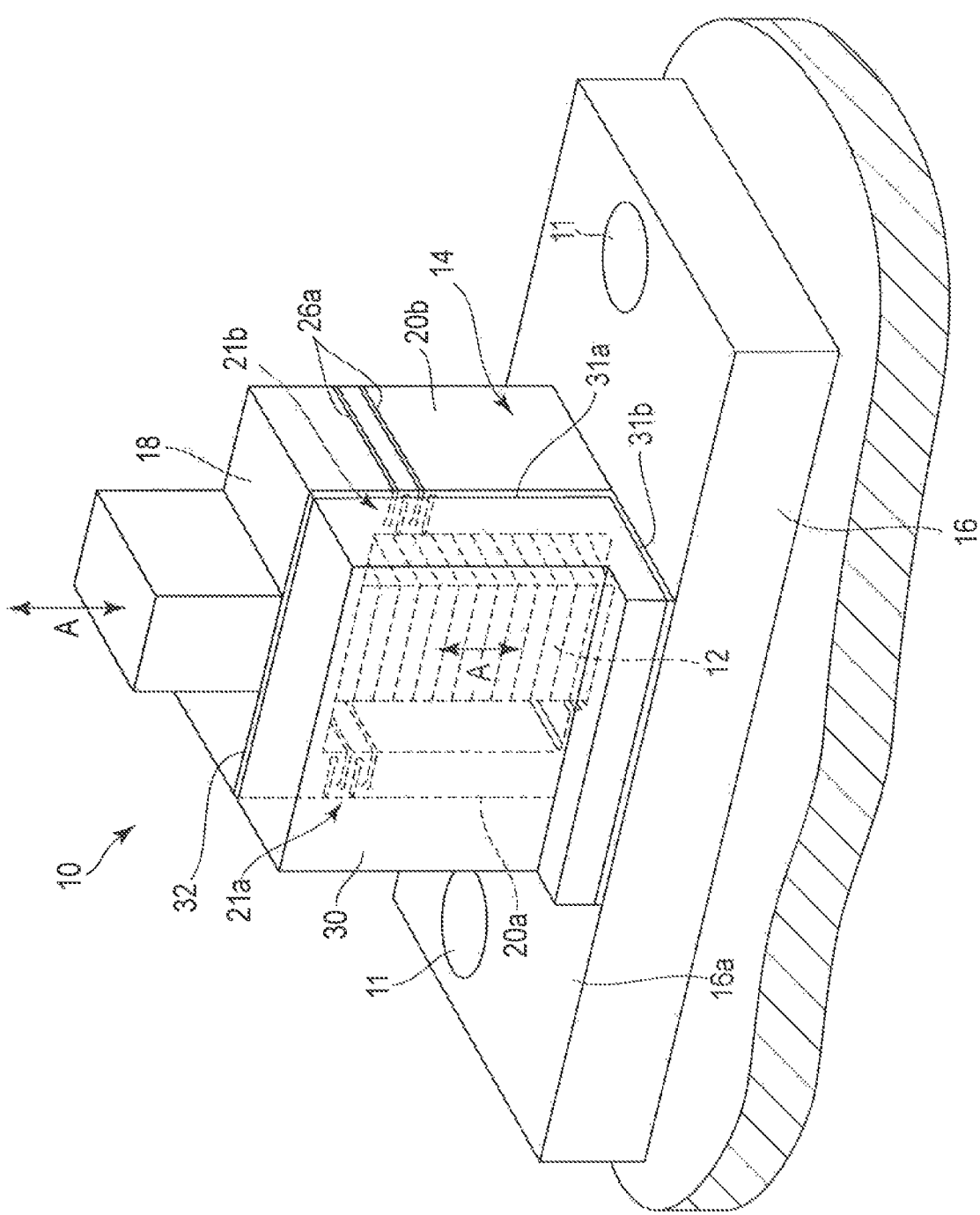
F I G. 10

METHOD OF DAMPING ACTUATOR WITH TRANSLATION MECHANISM AND ACTUATOR

CROSS-REFERENCE TO RELATED APPLICATIONS

This application is based upon and claims the benefit of priority from prior Japanese Patent Application No. 2013-011990, filed Jan. 25, 2013, the entire contents of which are incorporated herein by reference.

FIELD

Embodiments described herein relate generally to a method of damping an actuator, which comprises a piezoelectric element and a translation mechanism, and an actuator comprising a damping mechanism.

BACKGROUND

A laminated piezoelectric element is a driving element that is very effective for high-precision positioning. The laminated piezoelectric element comprises many layers of piezoelectric material such as $PbZrO_3$—$PbTiO_3$ (PZT), which has excellent high-speed responsiveness and can produce a great force. However, the displacement of this piezoelectric element for drive is very small (about 1/1,000 of the laminate height). Further, there is a problem that if a substantial shear load is applied to the piezoelectric element itself, the bonding surfaces on which the layers of piezoelectric material and electrodes are alternately connected easily break. Thus, it is necessary to take account of methods of fixing and supporting the piezoelectric element, connection with parts to be driven, etc. If the single piezoelectric element is to be used as an actuator, therefore, it is very awkward to handle and requires certain countermeasures.

Accordingly, an actuator is proposed in which a laminated piezoelectric element is combined with a displacement magnification mechanism that geometrically enlarges a small displacement produced by the piezoelectric element and, at the same time, facilitates attachment to fixing portions and parts to be driven. Another actuator is proposed in which a laminated piezoelectric element is combined with a translation mechanism that directly converts a great thrust or small displacement produced by the piezoelectric element into a rectilinear motion without magnification, and at the same time, facilitates attachment to fixing portions and parts to be driven, based on a high resonance characteristic inherent to the piezoelectric element. Still another actuator is proposed in which a restraint plate is affixed to a movable part of a displacement magnification mechanism with a viscoelastic body therebetween, in order to suppress a high resonance amplitude that affects the control performance, incidentally making use of a high resonance characteristic of a piezoelectric element, thereby reducing a large amplitude of a resonance peak of the movable part.

However, if the damping mechanism comprising the viscoelastic body and restraint plate is applied to the actuator that comprises the translation mechanism configured to convert a thrust of the laminated piezoelectric element into a rectilinear motion, not the displacement magnification mechanism comprising a parallel link and lever mechanism, a sufficient damping effect cannot be achieved although the viscoelastic body is strained due to extension by the same laminated piezoelectric element. Thus, it can be assumed that, in the translation mechanism configured to directly transmit a thrust or displacement of the piezoelectric element, the viscoelastic body cannot be effectively strained by the combination of the viscoelastic body and restraint plate, so that the vibration damping effect is reduced.

This invention has been made in view of these circumstances, and its object is to provide a damping method and an actuator with a damping mechanism, configured so that the inherent resonance peak of the actuator can be sufficiently damped without degrading the characteristics of the actuator that comprises a piezoelectric element and a translation mechanism.

BRIEF DESCRIPTION OF THE DRAWING

FIG. 10 is a perspective view showing an actuator according to a second embodiment;

DETAILED DESCRIPTION

Various embodiments will be described hereinafter with reference to the accompanying drawings. In general, according to one embodiment, there is provided a method of damping an actuator to reduce an amplitude of a resonance peak of the actuator, which comprises a piezoelectric element and a translation mechanism comprising a movable part, which is displaced as the piezoelectric element is displaced, and configured to directly transmit the displacement of the piezoelectric element as a rectilinear motion, the method comprising:

securing one surface of a restraint member having at least two surfaces to the movable part with an elastic or viscoelastic body therebetween;

securing the other surface of the restraint member to a support portion of the translation mechanism with an elastic or viscoelastic body therebetween; and converting vibration energy of the movable part into thermal energy, based on distortion caused by deformation of the elastic or viscoelastic body, to reduce the amplitude of the resonance peak of the actuator.

First Embodiment

Figure 1:
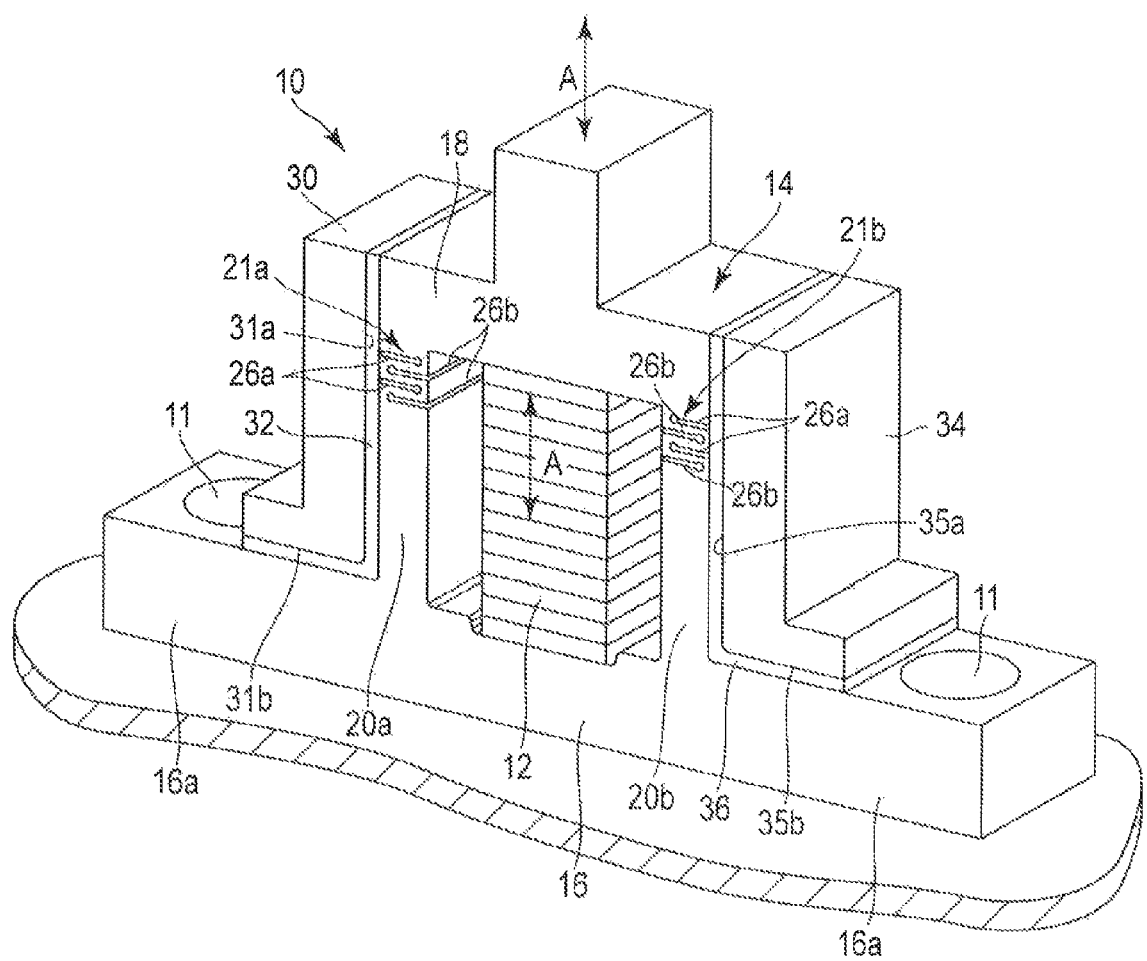
FIG. 1 is a perspective view showing an actuator according to a first embodiment.

FIG. 1 shows an actuator 10 according to a first embodiment. The actuator 10 comprises a laminated piezoelectric element 12 and a translation mechanism 14, which transmits a thrust or displacement of the piezoelectric element 12 as a rectilinear motion. The piezoelectric element 12 expands and contracts in its lamination direction (A-direction), thereby transmitting the produced thrust. The translation mechanism 14 comprises a prismatic support portion 16, prismatic mover 18, and a pair of prismatic, elastic spring bearing portions 20a and 20b and is in the form of a substantially rectangular frame as a whole. The mover 18 is opposed substantially parallel to the support portion 16 with a gap therebetween. The elastic spring bearing portions 20a and 20b extend between the support portion 16 and mover 18 and are opposed parallel to each other. The piezoelectric element 12 is located between the support portion 16 and mover 18 so that its upper and lower longitudinal ends are secured to the mover 18 and support portion 16, respectively. Further, the piezoelectric element 12 is arranged so that its expansion/contraction direction A is perpendicular to the support portion 16 and parallel to the elastic spring bearing portions 20a and 20b.

The support portion 16, elastic spring bearing portions 20a and 20b, and mover 18 of the translation mechanism 14 are integrally molded from a highly stiff material, such as ceramic or metal (for example, duralumin [high-strength aluminum], stainless steel, titanium alloy, etc.). The mover 18 and spring portions of the elastic spring bearing portions 20a and 20b function as a movable part of the translation mechanism 14. Axially opposite end portions 16a of the support portion 16 extend beyond the spring bearing portions 20a and 20b on the opposite sides. Each opposite end portion 16a is formed with a through-hole or threaded hole 11 through which the support portion 16 is secured to a desired region by a screw.

Spring portions 21a and 21b are formed on the upper end portions, that is, mover-side end portions, of the elastic spring bearing portions 20a and 20b, respectively. A plurality (for example, two) of spring slits 26a are formed in one side surface of each of the spring portions 21a and 21b that extends parallel to the piezoelectric element 12. These spring slits 26a are formed parallel to each other with a gap therebetween and extend perpendicular to the expansion/contraction direction A of the piezoelectric element 12. A plurality (for example, two) of spring slits 26b are formed in the other side surface of each of the spring portions 21a and 21b that extends parallel to the piezoelectric element 12 and is opposed to the one side surface. These spring slits 26b are formed parallel to each other with a gap therebetween and extend perpendicular to the expansion/contraction direction A. Further, the spring slits 26b are alternately arranged side by side with the spring slits 26a in the opposite side surface in the direction parallel to the expansion/contraction direction A.

The pair of spring portions 21a and 21b constitute a parallel spring, whose elastic deformation is restricted only in a buckling direction, or in this case, a linear-motion direction parallel to the expansion/contraction direction A, and which can be elongated in the buckling direction. The mover 18 is supported on the elastic spring bearing portions 20a and 20b and support portion 16 by the spring portions 21a and 21b and can move only in the translation direction A in response to the linear motion of the spring portions 21a and 21b.

If the piezoelectric element 12 produces such a thrust that it is displaced in the expansion/contraction direction A, this displacement directly drives the mover 18 and is transmitted as a rectilinear motion. The mover 18 is guided in such a manner that it is restricted only to the rectilinear motion by the pair of elastic spring bearing portions 20a and 20b on the opposite sides of the piezoelectric element 12. Thus, the displacement of the piezoelectric element 12 propagates as a pure rectilinear motion to the mover 18, whereupon the mover 18 moves relative to the support portion 16 in the translation direction A. As the spring portions 21a and 21b are elastically deformed by the thrust produced by the piezoelectric element 12, the elastic spring bearing portions 20a and 20b enable the mover 18 to achieve a high resonant frequency and accurate rectilinear motion. Further, the elastic spring bearing portions 20a and 20b ease external stress applied to the piezoelectric element 12 through the mover 18 and support portion 16 so that the external stress is kept from acting as a shear stress or the like on the piezoelectric element 12.

As shown in FIG. 1, a restraint member 30 is secured as a damping mechanism to the translation mechanism 14 including the movable part with an elastic or viscoelastic body therebetween. In the present embodiment, the restraint member 30 is a prismatic block or L-shaped angle plate made of a material more stiff than the elastic or viscoelastic body, such as ceramic or metal (for example, aluminum, stainless steel, etc.). An elastic or viscoelastic body 32 is applied to at least two surfaces of the restraint member and forms a viscoelastic layer. For example, the restraint member 30 is an L-shaped angle plate of about 1 to 5 mm thickness that is sufficiently stiff to withstand buckling caused by vertical motion. The restraint member 30 not only serves to bind the translation mechanism 14 but also has sufficient strength as a structural member. The viscoelastic body 32 is formed with a thickness of about 0.04 to 0.20 mm.

The two surfaces of the restraint member 30 are secured to the translation mechanism 14 in such a manner that the viscoelastic body 32 is in surface contact with surfaces of the translation mechanism 14. In this arrangement, one surface 31a of the restraint member 30 is secured to the outer surface of the elastic spring bearing portion 20a and a side surface of the mover 18 so that the support portion (fixed portion) and movable part are bridged to each other. The other surface 31b is secured to the upper surface of one of the end portions 16a of the support portion 16. The restraint member 30 can be secured to the translation mechanism 14 with an adhesive or by means of the viscosity of the viscoelastic body 32 itself. Alternatively, the restraint member may be mechanically connected to the translation mechanism. Specifically, the restraint member 30 and translation mechanism 14 can be mechanically secured to each other by screws or the like with the elastic or viscoelastic body between them. In this case, the restraint member is secured to the outer surface of the elastic spring bearing portion 20a, mover 18, and support portion 16.

In the present embodiment, moreover, the restraint member and viscoelastic body are provided not only on one surface of the actuator 10 but also on the other side surface. Specifically, a restraint member 34 in the form of an L-shaped angle plate has its one surface 35a secured to the outer surface of the elastic spring bearing portion 20b and a side surface of the mover 18 so that the support portion (fixed portion) and movable part are bridged to each other. The other surface 35b of the restraint member 34 is secured to the upper surface of the other end portion 16a of the support portion 16 with a viscoelastic body 36 therebetween. The restraint member 34 can be secured to the translation mechanism 14 with an adhesive or by means of the viscosity of the viscoelastic body 36 itself. Alternatively, the restraint member may be mechanically connected to the translation mechanism. Specifically, the restraint member 34 and translation mechanism 14 can be mechanically secured to each other by screws or the like with the elastic or viscoelastic body between them. In this case, the restraint member is secured to the outer surface of the elastic spring bearing portion 20b, mover 18, and support portion 16.

According to the actuator 10 constructed in this manner, the restraint member 30 is disposed spanning the mover 18, elastic spring bearing portion 20a, and support portion 16 to deliberately restrict the action of the elastic spring bearing portion, so that the viscoelastic body 32 can be efficiently strained as the translation mechanism 14 vibrates. Since the restraint member 30 is subjected to buckling stress from the translation mechanism 14, it is formed into an L-shaped or block-like structure with a sufficient thickness, mass, and stiffness, a plurality of surfaces of which are secured to the translation mechanism 14. Accordingly, deformation of the surface of the viscoelastic body 32 on the restraint-member side can be suppressed by the restraint member 30, so that the distortion of the viscoelastic body 32 can be efficiently increased. By being strained, the viscoelastic body 32 converts vibrational energy into thermal energy, thereby damping vibration. Thus, the resonant frequency can be kept from being reduced although a high resonance peak inherent to the actuator 10, which comprises the translation mechanism 14 and laminated piezoelectric element 12, is effectively damped. The resonant frequency of the actuator, as well as its mechanical stiffness, can be increased by affixing and securing the restraint member, which is made of a metal or ceramic material more stiff than the elastic or viscoelastic body, to the translation mechanism.

Further, the restraint members 30 and 34 and viscoelastic bodies 32 and 36 are disposed spanning between the support portion 16 and mover 18 on the left and right side surfaces of the translation mechanism 14, and the actuator 10 is restricted so that the movable part moves straight in the same direction as the motion of the piezoelectric element 12. In this way, the motion of the translation mechanism 14 can be restricted to directions other than the direction of the rectilinear movement so that undesired deformation, such as torsion, and a lateral deflection of the mover 18 can be effectively suppressed. Consequently, vibration modes other than a main resonance mode can also be suppressed or damped.

The restraint members 30 and 34 are provided on the side surfaces of both the elastic spring bearing portions 20a and 20b of the actuator 10 with the elastic or viscoelastic bodies therebetween. When compared with the case where the restraint member is provided on the side surface of only one of the elastic spring bearing portions, therefore, the amplitude of the resonance peak of the actuator can be substantially halved.

An actuator with no damping mechanism and the actuator 10 according to the first embodiment were prepared and their frequency characteristics were compared. For the actuator 10 of the first embodiment, restraint members of aluminum alloy A5052 (1.14 g), stainless steel SUS303 (1.92 g), and stainless steel SUS303 (3.92 g) were provided.

Figure 2:
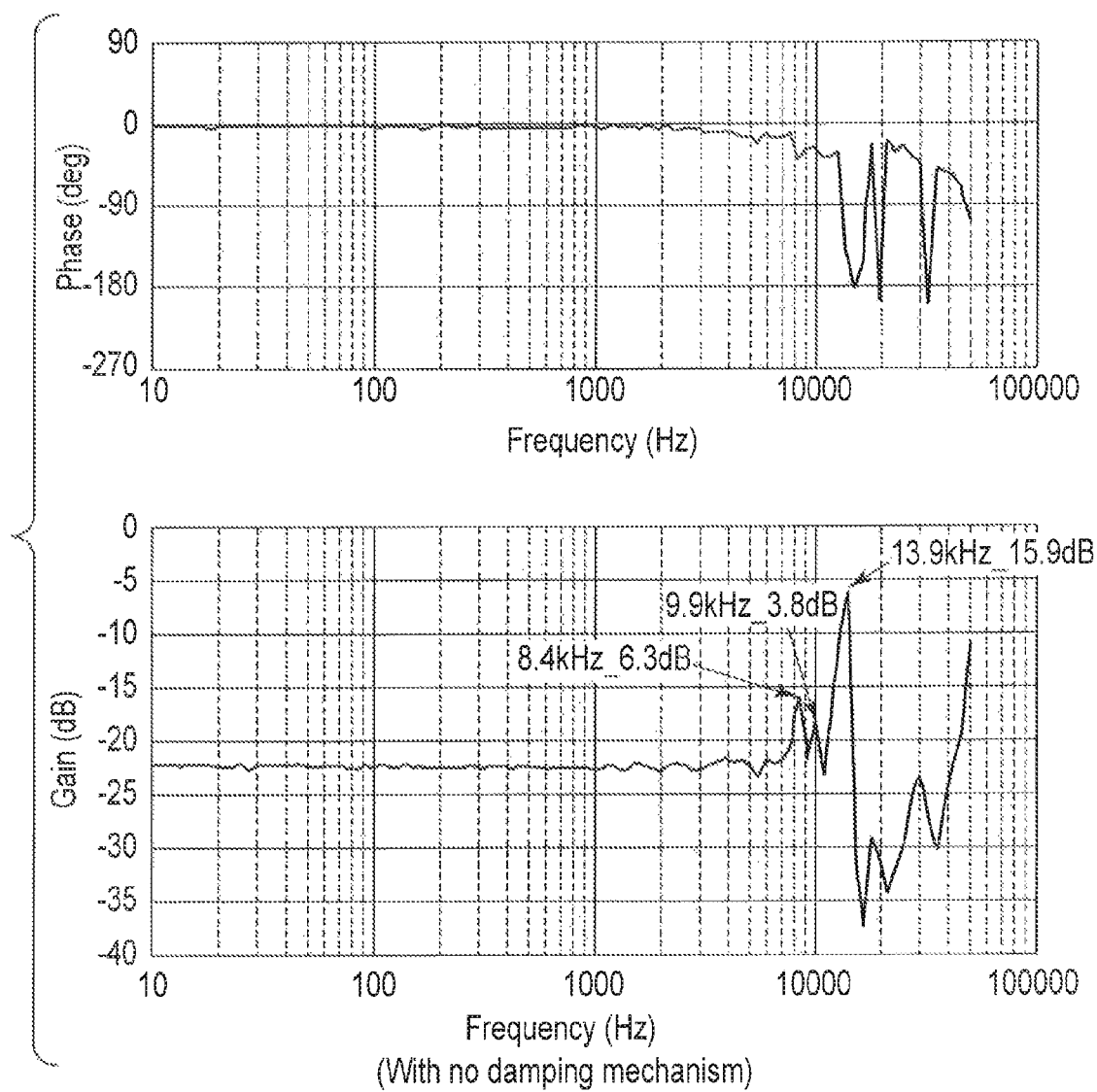
FIG. 2 is a diagram showing frequency characteristics of an actuator with no damping mechanism, as a comparative example.
Figure 3:
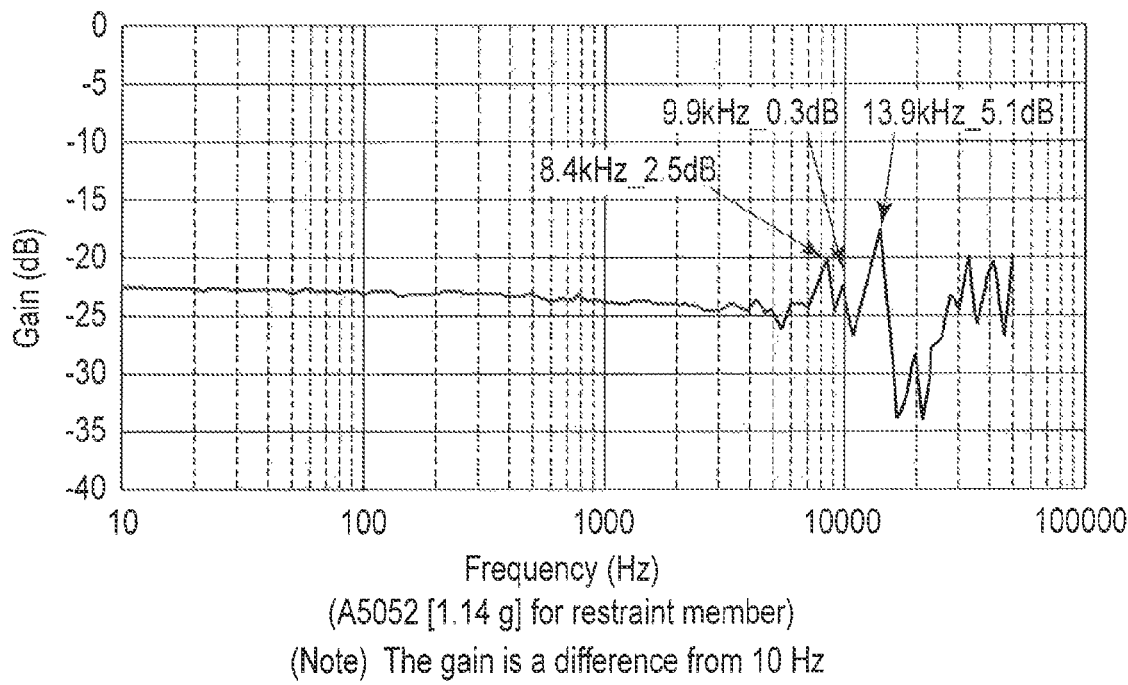
FIG. 3 is a diagram showing frequency characteristics of the actuator of the first embodiment comprising an aluminum damper (damping mechanism)
Figure 4:
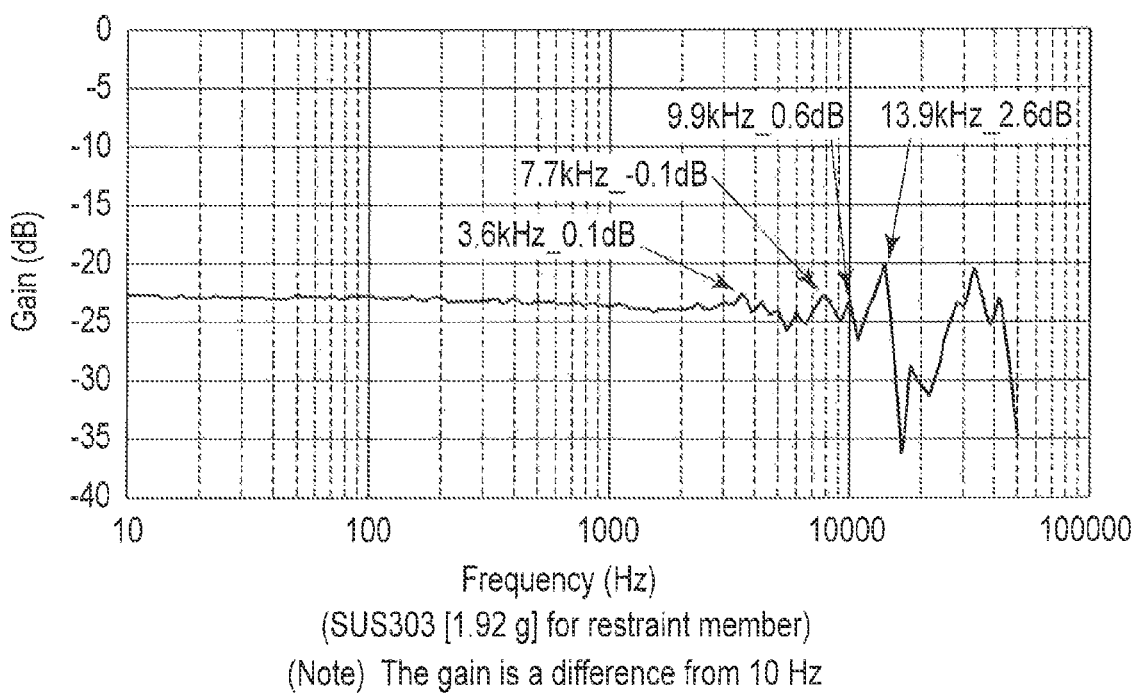
FIG. 4 is a diagram showing frequency characteristics of the actuator of the first embodiment comprising a stainless-steel damper (damping mechanism)
Figures 5, 6:
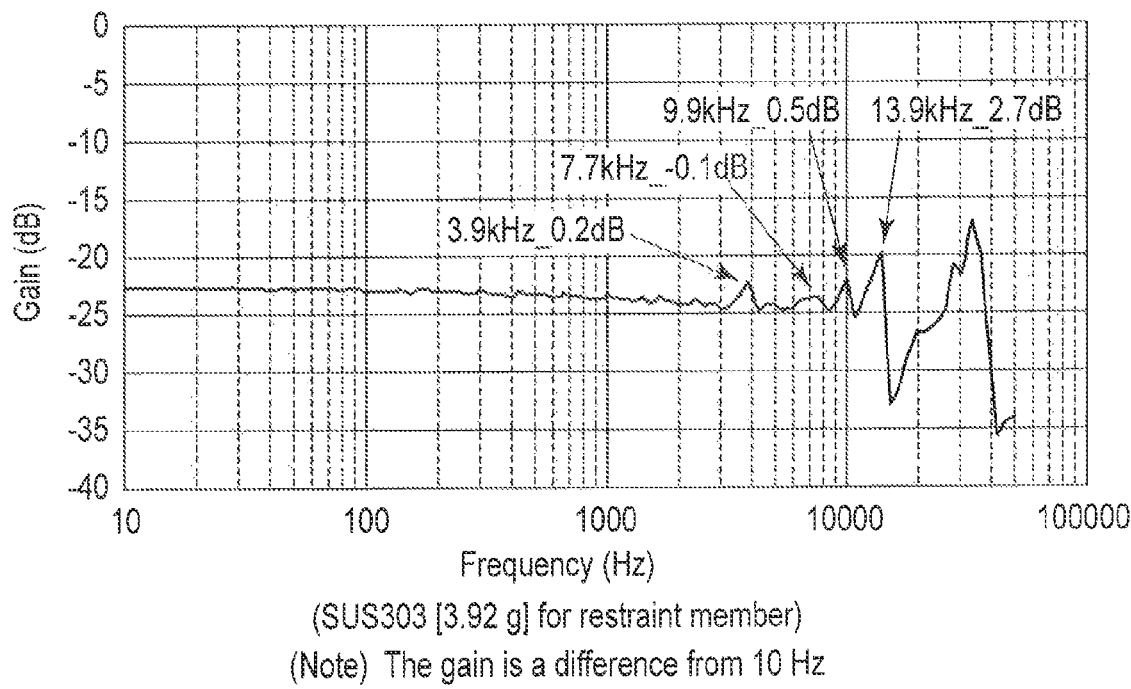
FIG. 5 is a diagram showing frequency characteristics of the actuator of the first embodiment comprising another stainless-steel damper (damping mechanism)
FIG. 6 is a diagram comparatively showing values of main resonance points.

FIG. 2 shows the frequency characteristics (gain and phase characteristics) of the actuator (a comparative example) with no damping mechanism (comprising restraint members and viscoelastic body). FIGS. 3, 4 and 5 show the frequency characteristics (gain characteristics only) of actuators with the restraint members of aluminum alloy A5052 (1.14 g), stainless steel SUS303 (1.92 g), and stainless steel SUS303 (3.92 g), respectively. Since damping characteristics are clearly represented by the gain characteristics, the phase characteristics are not specifically shown in FIGS. 3 to 5. FIG. 6 comparatively shows the amplitudes (differences from the gains at 10 Hz) of resonance points at resonant frequencies of 13.9 and 9.9 kHz for the actuators.

As seen from FIGS. 2 to 6, the actuator with no damping mechanism is a mechanism based on second-order lag elements that can be basically represented by a single spring, damper, and mass, and involves a very high resonance peak of 15.9 dB at the resonant frequency of 13.9 kHz. According to the actuator of the first embodiment in which the restraint member 30 of aluminum alloy with the sandwiched viscoelastic bodies is secured to the translation mechanism 14, the resonance peak is damped to 5.1 dB at the resonant frequency of 13.9 kHz, and the amplitude of the resonance peak of the actuator is considerably reduced to about ⅓ that of the actuator with no damping mechanism. It can be seen that the amplitude of the resonance peak is also considerably reduced compared with that of the amplitude at other resonant frequencies of 9.9 and 8.4 kHz. Likewise, in the case where the restraint member 30 of SUS303 (1.92 g) is used, it can be seen that the resonance peak is damped to 2.6 dB at the resonant frequency of 13.9 kHz, and the amplitude of the resonance peak of the actuator is also considerably reduced to about ⅙ that of the actuator with no damping mechanism. In the case where the restraint member is provided on the side surface of only one of the elastic spring bearing portions, in contrast, it is confirmed that the amplitude is half that of the case where the restraint members are secured to the two opposite side surfaces, and that a damping effect is proportional to an installation area for the restraint members with the viscoelastic bodies therebetween.

Figure 7:
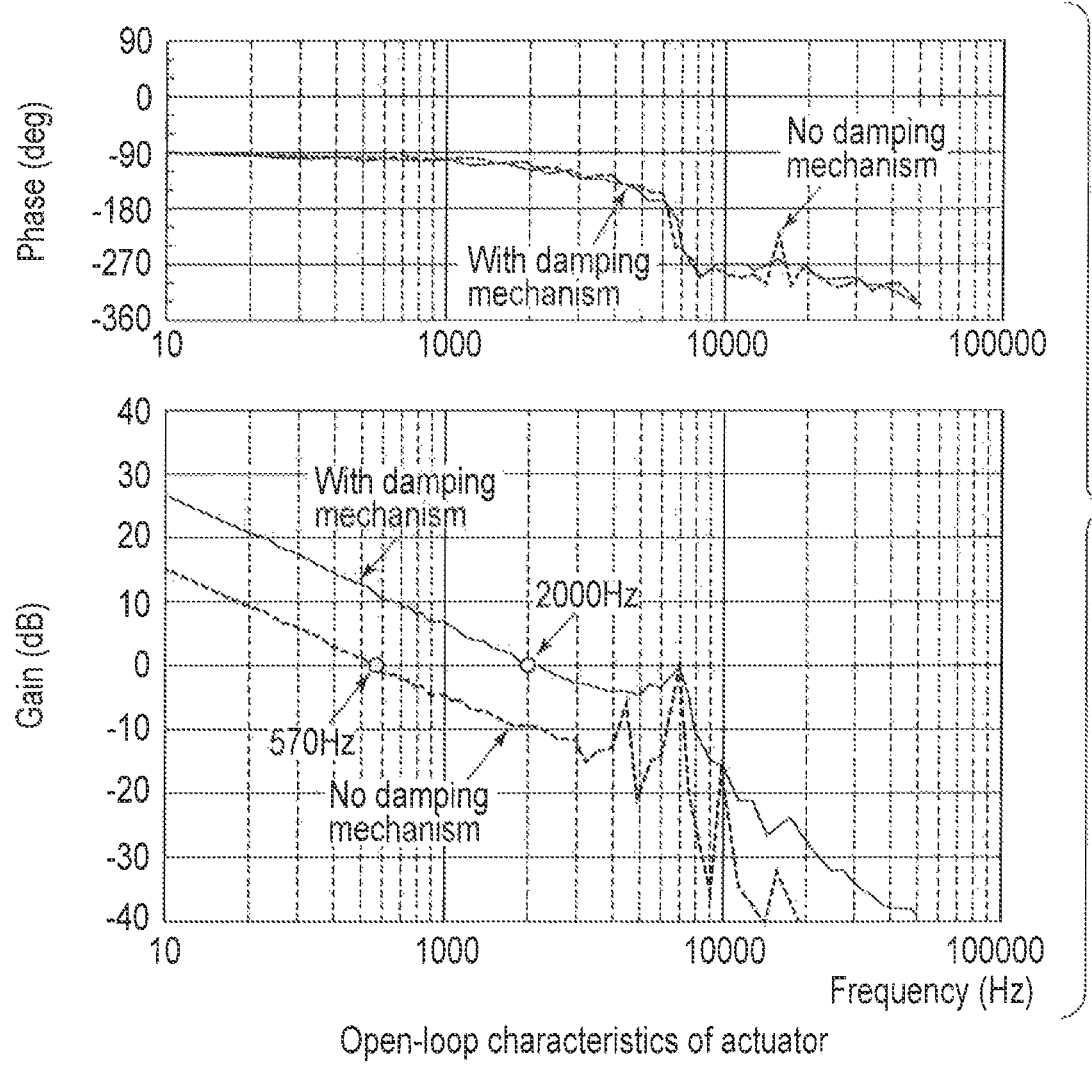
FIG. 7 is a diagram comparatively showing open-loop characteristics of a control system for the actuator of the first embodiment and an actuator with no damping mechanism according to a comparative example.

Based on the damping effect obtained in this manner, the controllability of the actuator can be dramatically improved. FIG. 7 shows open-loop characteristics of a PI control system measured when the system is constructed using a high-speed bipolar amplifier as a drive source for the actuator with an optical-fiber displacement meter used as a position feedback. If the control system is constructed using the actuator with no damping mechanism, its high resonance peak facilitates the attainment of the 0-dB line as a standard for the stabilization of the control system. Thus, an obtained servo bandwidth (control bandwidth) is such a very low bandwidth of 570 Hz that the control performance cannot be easily improved.

In the case of the actuator of the present embodiment with the damping mechanisms, that is, the viscoelastic bodies and restraint members, attached individually to the opposite surfaces, in contrast, the resonance peak can be considerably damped so that a large margin can be obtained before the 0-dB line is reached. Therefore, the servo bandwidth, having so far been restricted to a low bandwidth by the resonance peak, can be considerably extended. Consequently, in the actuator of the present embodiment, the servo bandwidth of the control system can be set to 2,000 Hz, which is 3.5 times higher than that of the actuator with no damping mechanism.

Figure 8:
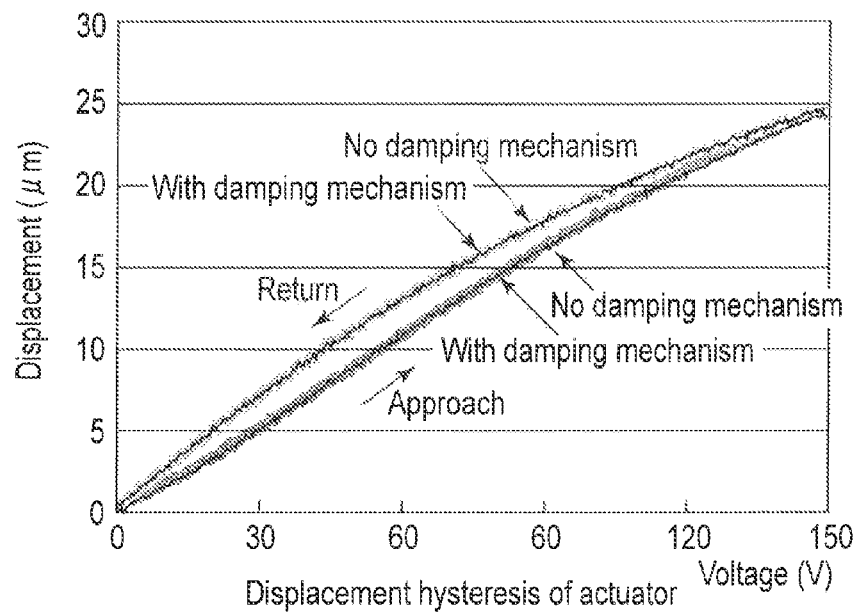
FIG. 8 is a diagram comparatively showing displacement hysteresis of the actuator of the first embodiment and the actuator with no damping mechanism according to the comparative example.

Even if the control performance is improved in this manner, reduction of the displacement should substantially be avoided in the actuator that combines the laminated piezoelectric element and the translation mechanism. Although the restraint members are attached to the side surfaces of the pair of elastic spring bearing portions 20a and 20b of the translation mechanism according to the embodiment described above, however, the reduction of the maximum displacement of the actuator is less than 1% of that of the actuator with no damping mechanism, which is within a measurement error range, as shown in FIG. 8. According to the present embodiment, moreover, resonance modes other than a translation mode that develops around the main resonance mode can be effectively suppressed. Thus, a high control bandwidth (servo bandwidth) that cannot be achieved by the actuator with no damping mechanism can be reconciled with the function of effectively transmitting the expansion/contraction of the laminated piezoelectric element by deliberately designing resonance frequencies other than those in the main resonance mode that suppress the control performance and prevent accurate translation.

In order to uniformly deform the translation mechanism 14 to improve the damping properties, it is desirable to dispose the elastic or viscoelastic bodies and restraint members on the opposite side surfaces of the translation mechanism 14. However, a great damping effect can be obtained in proportion to an installation area for the damping mechanism even in the case where the members are provided only on one side surface.

Thus, according to the first embodiment, there can be provided a damping method and an actuator, capable of sufficiently reducing the inherent resonance peak of the actuator, which comprises a piezoelectric element and translation mechanism, without degrading the characteristics of the actuator.

Figure 9:
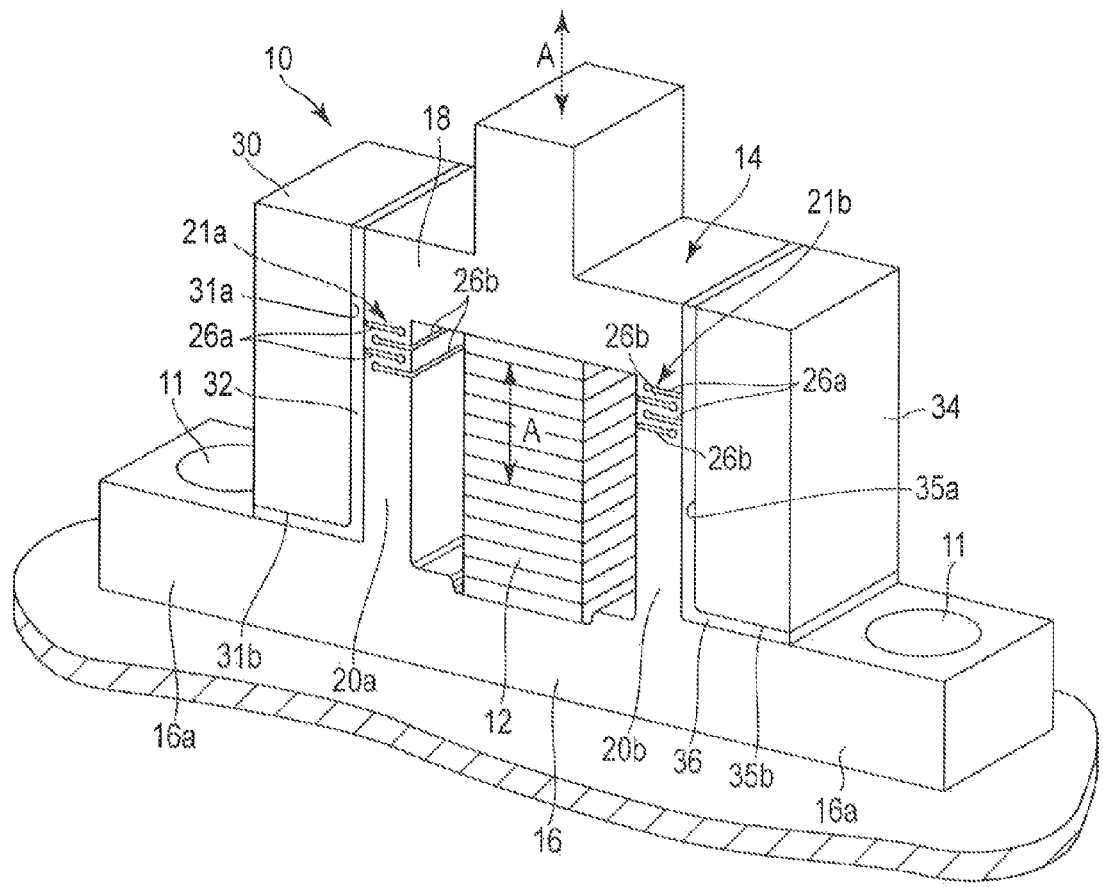
FIG. 9 is a perspective view showing an actuator according to a first modification.

In the first embodiment, the restraint members 30 and 34 may be formed into a rectangular block, as in a first modification shown in FIG. 9. In this case, the two surfaces of each of the restraint members 30 and 34 are secured to the side surface of the translation mechanism 14 and the upper surface of the support portion with the elastic or viscoelastic body therebetween. This can be done by various alternative methods based on the adhesive force of the viscoelastic body or mechanical connection between the restraint member and translation mechanism. The same damping effect as that of the first embodiment can be obtained by the use of this restraint member.

The following is a description of actuators according to alternative embodiments. In the description of these alternative embodiments to follow, like reference numbers are used to designate the same parts as those of the first embodiment, and a detailed description thereof is omitted. Thus, parts different from those of the first embodiment will be mainly described in detail hereinafter.

Second Embodiment

FIG. 10 shows an actuator 10 according to a second embodiment. According to the present embodiment, an elastic or viscoelastic body and restraint member are secured to the front and/or rear side of a translation mechanism 14. Specifically, a restraint member 30 is a prismatic block or L-shaped angle plate made of a material more stiff than the elastic or viscoelastic body, such as ceramic or metal (for example, aluminum, stainless steel, etc.). An elastic or viscoelastic body 32 is applied to at least two surfaces of the restraint member and forms a viscoelastic layer. For example, the restraint member 30 is an L-shaped angle plate of about 1 to 5 mm thickness that is sufficiently stiff to withstand buckling caused by vertical motion. The restraint member 30 not only serves to bind the translation mechanism 14 but also has high stiffness. The viscoelastic body 32 is formed with a thickness of about 0.04 to 0.20 mm.

The two surfaces of the restraint member 30 are secured to the translation mechanism 14 in such a manner that the viscoelastic body 32 is in surface contact with surfaces of the translation mechanism 14. In this arrangement, one surface 31a of the restraint member 30 is secured to the respective front surfaces of a mover 18 and a pair of elastic spring bearing portions 20a and 20b, while the other surface 31b is secured to the upper surface of a support portion 16. The restraint member 30 can be secured to the translation mechanism 14 with an adhesive or by means of the viscosity of the viscoelastic body 32 itself. This securing method is not particularly limited if the restraint member and translation mechanism are mechanically connected to each other so that the elastic or viscoelastic body can be effectively strained.

Other configurations of the actuator 10 are the same as those of the above-described first embodiment, and a detailed description thereof is omitted.

According to the second embodiment, the viscoelastic body 32 and restraint member 30 are secured spanning the front surface of the mover 18, the front surfaces of the elastic spring bearing portions 20a and 20b, and the upper surface of the support portion 16, so that the mover and elastic spring bearing portions can be kept from vibrating. In this way, an effect of reducing the amplitude of a resonance peak can be obtained without damaging inherent properties of the actuator 10, such as the maximum displacement, main resonant frequency, and translational motion. In order to uniformly deform the translation mechanism 14 to improve the damping properties, it is desirable to dispose the elastic or viscoelastic bodies and restraint members on both the front and rear surfaces of the translation mechanism 14. However, a great damping effect can be obtained even in the case where the members are provided only on one of the two surfaces. Also for other points, the same functions and effects as those of the first embodiment can be obtained from the second embodiment.

Third Embodiment

Figure 11:
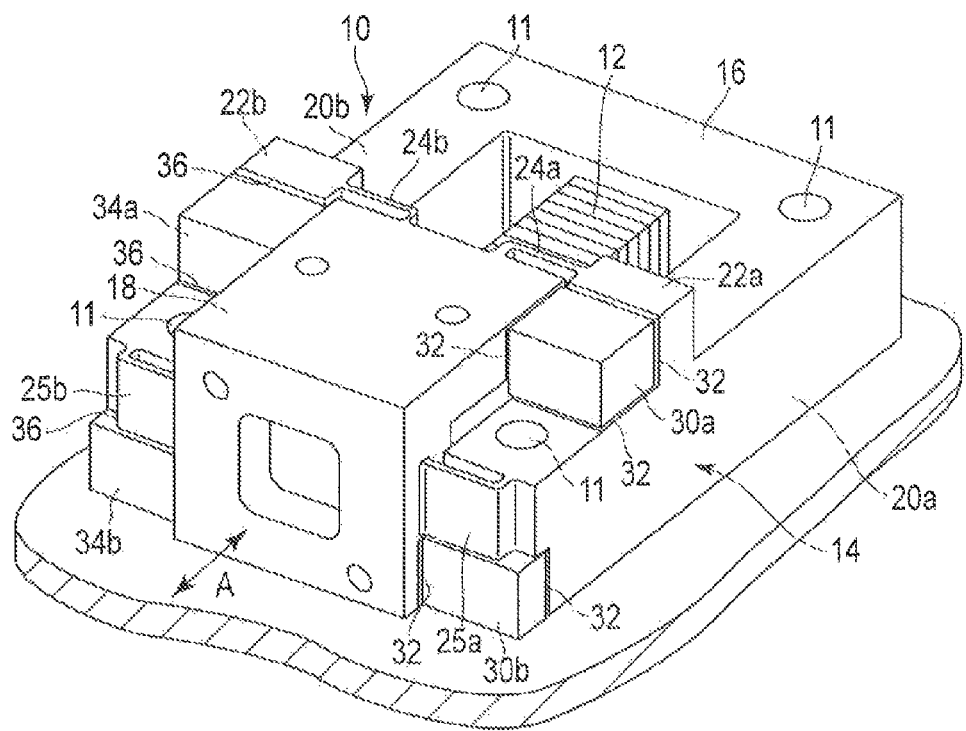
FIG. 11 is a perspective view showing an actuator according to a third embodiment.
Figure 12:
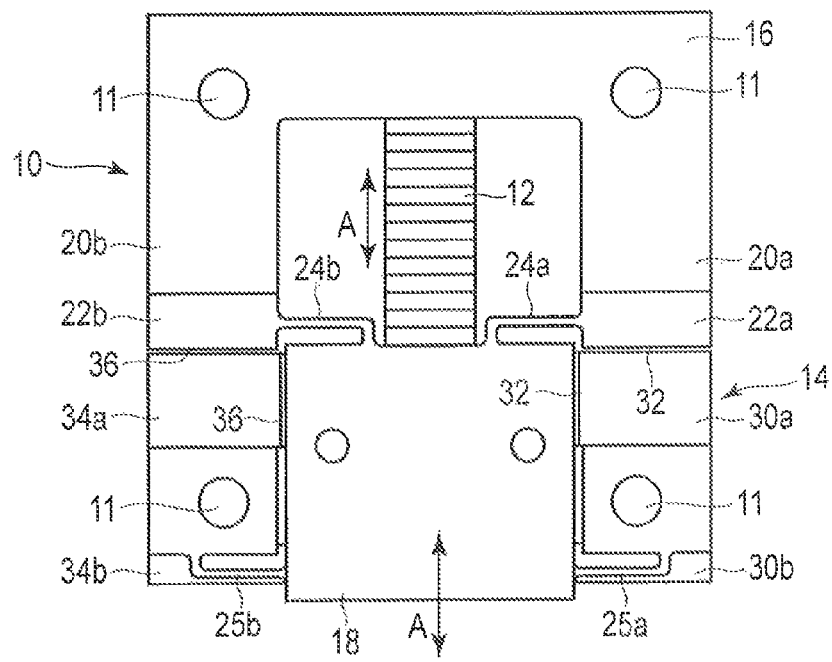
FIG. 12 is a plan view of the actuator according to the third embodiment.

FIGS. 11 and 12 are perspective and plan views, respectively, showing an actuator 10 according to a third embodiment. The actuator according to the first embodiment is of the so-called vertical type, while the actuator according to the third embodiment is of the so-called horizontal type. However, the direction and form of installation do not matter. For example, the direction for movement may be coincident with or perpendicular to the direction of gravity.

The actuator 10 comprises a laminated piezoelectric element 12 and a translation mechanism 14, which transmits a thrust or displacement of the piezoelectric element 12 as a rectilinear motion. The piezoelectric element 12 expands and contracts in its lamination direction (A-direction), thereby producing the thrust. The translation mechanism 14 comprises a prismatic support portion 16, elastic spring bearing portions 20a and 20b, and rectangular block-like mover 18. The elastic spring bearing portions 20a and 20b extend substantially horizontally from the opposite longitudinal end portions of the support portion and are opposed parallel to each other. The mover 18 is located between the respective extending end portions of the elastic spring bearing portions 20a and 20b and opposed to the support portion 16 with a gap therebetween.

The elastic spring bearing portion 20a integrally comprises a support projection 22a and plate springs 24a and 25a. The support projection 22a protrudes from an intermediate portion of the upper surface of the bearing portion 20a. The plate spring 24a extends from the support projection 22a and is connected to the rear surface of the mover 18 that faces the support portion 16. The plate spring 25a extends from the distal end surface of the elastic spring bearing portion 20a and is connected to a side surface of the distal end portion of the mover 18. The elastic spring bearing portion 20b on the opposite side integrally comprises a support projection 22b and plate springs 24b and 25b. The support projection 22b protrudes from an intermediate portion of the upper surface of the bearing portion 20b. The plate spring 24b extends from the support projection 22b and is connected to the rear surface of the mover 18. The plate spring 25b extends from the distal end surface of the elastic spring bearing portion 20b and is connected to a side surface of the distal end portion of the mover 18.

Respective elastic deformations of the two sets of plate springs 24a, 24b, 25a and 25b are restricted only to a buckling direction, or in this case, a linear-motion direction parallel to the expansion/contraction direction A of the piezoelectric element 12. The mover 18 is supported on the elastic spring bearing portions 20a and 20b by the two sets of plate springs 24a, 24b, 25a, and 25b and can move only in the translation direction A in response to the linear motion of the plate springs 24a, 24b, 25a, and 25b.

The support portion 16, elastic spring bearing portions 20a and 20b, and mover 18 of the translation mechanism 14 are integrally molded from a highly stiff material, such as ceramic or metal (for example, aluminum alloy, stainless steel, titanium alloy, etc.). The mover 18 and the plate springs 24a, 24b, 25a, and 25b of the elastic spring bearing portions 20a and 20b function as a movable part of the translation mechanism 14. The lower surface side of the support portion 16 and elastic spring bearing portions are secured on desired regions. Further, each of the opposite longitudinal end portions of the support portion 16 and the distal end portion of each of the elastic spring bearing portions 20a and 20b are formed with a through-hole or threaded hole 11 through which the support portion 16 or each bearing portion is secured to a desired region by a screw.

The piezoelectric element 12 is located between the support portion 16 and mover 18 so that its one and the other longitudinal ends are secured to the support portion 16 and the rear surface of the mover 18, respectively. Further, the piezoelectric element 12 is disposed so that its expansion/contraction direction A is perpendicular to the support portion 16 and parallel to the elastic spring bearing portions 20a and 20b.

If the piezoelectric element 12 produces such a thrust that it is displaced in the expansion/contraction direction A, this displacement is transmitted as a rectilinear motion and directly drives the mover 18. The mover 18 is guided in such a manner that it is restricted only to the rectilinear motion by the plate springs 24a, 24b, 25a, and 25b of the pair of elastic spring bearing portions 20a and 20b on the opposite sides of the piezoelectric element 12. Thus, the displacement of the piezoelectric element 12 propagates as a pure rectilinear motion to the mover 18, whereupon the mover 18 moves relative to the support portion 16 in the translation direction A. The elastic spring bearing portions 20a and 20b, having high stiffness, allow the plate springs 24a, 24b, 25a, and 25b to be regularly elastically deformed by the thrust produced by the piezoelectric element 12 and enable the mover 18 to achieve an accurate rectilinear motion and high resonant frequency. Further, the elastic spring bearing portions 20a and 20b ease external stress applied to the piezoelectric element 12 through the mover 18 and support portion 16 so that the external stress is kept from acting as a shear stress force or the like on the piezoelectric element 12.

As shown in FIGS. 11 and 12, restraint members 30 are secured as damping mechanisms to the translation mechanism 14 including the movable part with elastic or viscoelastic bodies therebetween. In the present embodiment, each restraint member 30 is a prism or rectangular block made of ceramic or metal, such as aluminum or stainless steel, and thicker than that of the first embodiment. An elastic or viscoelastic body 32 is applied to or sandwiched between at least two surfaces of the restraint member and forms a viscoelastic layer.

According to the present embodiment, the restraint members are provided near the plate springs 24a, 24b, 25a, and 25b. Specifically, a restraint member 30a is in the form of a rectangular block, three surfaces of which are secured individually to a side surface of the support projection 22a, the upper surface of the elastic spring bearing portion 20a, and a side surface of the mover 18 with the viscoelastic body 32 therebetween. A restraint member 30b is in the form of a prism, two surfaces of which are secured individually to the distal end surface of the elastic spring bearing portion 20a and the side surface of the mover 18 with the viscoelastic body 32 therebetween. Further, a restraint member 34a is in the form of a rectangular block, three surfaces of which are secured individually to a side surface of the support projection 22b, the upper surface of the elastic spring bearing portion 20b, and a side surface of the mover 18 with a viscoelastic body 36 therebetween. A restraint member 34b is in the form of a prism, two surfaces of which are secured individually to the distal end surface of the elastic spring bearing portion 20b and the side surface of the mover 18 with the viscoelastic body 36 therebetween. The restraint members can be secured to the translation mechanism 14 with an adhesive or by means of the viscosity of the viscoelastic bodies 32 and 36 themselves. Alternatively, the restraint members may be secured to the translation mechanism 14 by mechanical connection using screws.

According to the actuator 10 constructed in this manner, the restraint members 30a, 30b, 34a and 34b are disposed spanning the mover 18 and elastic spring bearing portions 20a and 20b to deliberately restrict the action of the elastic spring bearing portion, so that the viscoelastic bodies 32 and 36 can be efficiently strained as the translation mechanism 14 vibrates. Each restraint member is formed into a prism or block with a sufficient thickness, mass, and stiffness, a plurality of surfaces of which are secured to the translation mechanism 14. Accordingly, deformation of the surfaces of the viscoelastic bodies 32 and 36 on the restraint-member side can be suppressed by the restraint members, so that the distortion of the viscoelastic bodies 32 and 36 can be efficiently increased.

By being strained, the viscoelastic bodies 32 and 36 convert vibrational energy into thermal energy, thereby damping vibration. Since the plurality of surfaces of the prism or block are utilized according to the present embodiment, the area of contact between the movable part of the translation mechanism 14 and the restraint members and viscoelastic bodies increases, so that the amplitude of a resonance peak of the actuator 10 can be reduced more efficiently. Thus, the amplitude of the high resonance peak inherent to the actuator 10, which comprises the translation mechanism 14 and laminated piezoelectric element 12, can be effectively reduced while maintaining a high main resonant frequency of the actuator 10. Further, resonances other than a main resonance attributable to a torsional motion and up/down and left/right oscillation of the mover can be suppressed.

Thus, according to the third embodiment, there can also be provided a damping method and an actuator, capable of sufficiently reducing a large amplitude of the inherent resonance peak of the actuator, which comprises a piezoelectric element and translation mechanism, without degrading the characteristics of the actuator.

In order to uniformly deform the translation mechanism 14 to improve the damping properties, it is desirable to dispose the elastic or viscoelastic bodies and restraint members on the opposite sides of the mover of the translation mechanism 14. However, a great damping effect can be obtained according to the spanning area of the elastic or viscoelastic bodies.

Fourth Embodiment

Figure 13:
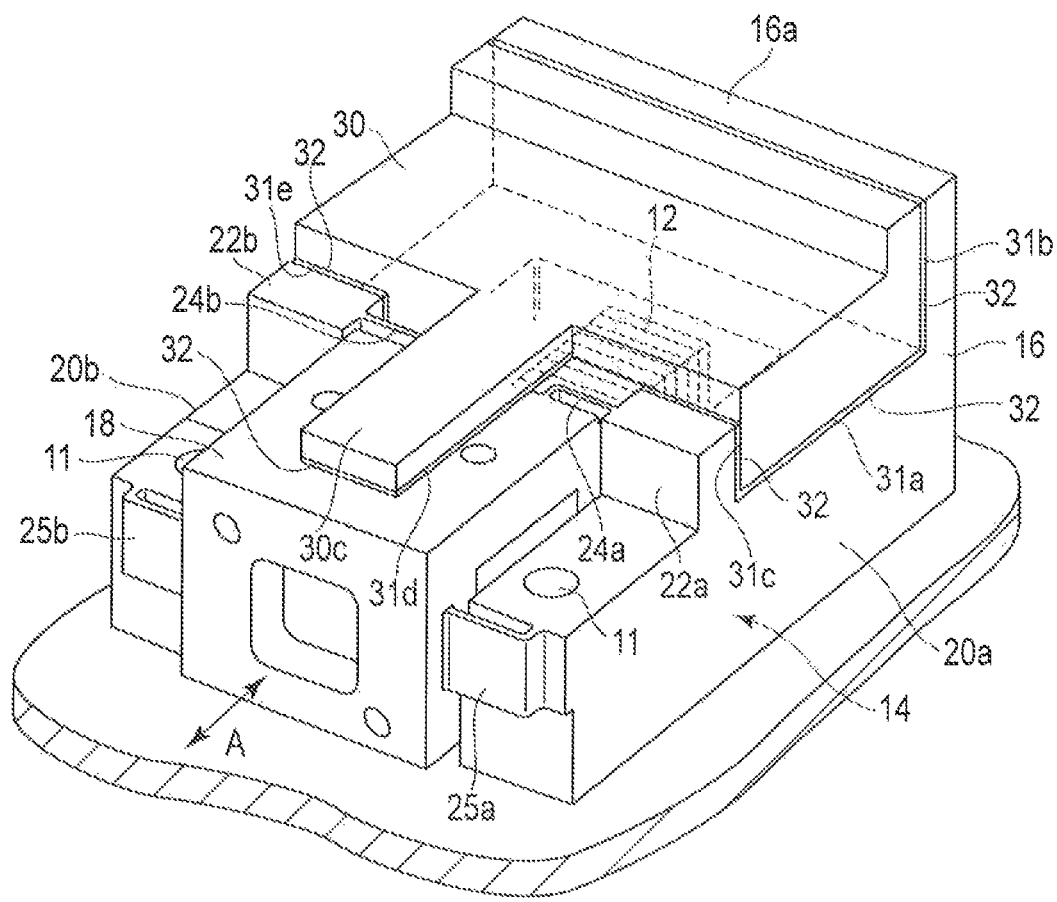
FIG. 13 is a perspective view showing an actuator according to a fourth embodiment.

FIG. 13 shows an actuator 10 according to a fourth embodiment. According to the present embodiment, the configuration of a translation mechanism 14 is the same as that of the third embodiment, except that a support portion 16 comprises an extending portion 16a that projects vertically upward. The fourth embodiment differs from the third embodiment in the configuration of the damping mechanism. An elastic or viscoelastic body and a restraint member 30 are secured to the upper surface side of the translation mechanism 14. Specifically, the restraint member 30 is an L-shaped angle plate made of a material more stiff than the elastic or viscoelastic body, such as ceramic or metal (for example, aluminum alloy, stainless steel, etc.), and integrally comprises a protrusion 30c in the form of an elongated plate that projects forward. An elastic or viscoelastic body 32 is applied to at least two surfaces of the restraint member 30 and forms a viscoelastic layer. For example, the restraint member 30 is an L-shaped angle plate of about 1 to 5 mm thickness that is sufficiently stiff to withstand buckling caused by vertical motion. The restraint member 30 not only serves to bind the translation mechanism 14 but also has high stiffness. The viscoelastic body 32 is formed with a thickness of about 0.04 to 0.20 mm.

According to the present embodiment, four surfaces of the restraint member 30 are secured to the translation mechanism 14 in such a manner that the viscoelastic body 32 is in surface contact with surfaces of the translation mechanism 14. In this arrangement, a principal surface 31a of the L-shaped angle plate of the restraint member 30 is secured spanning the respective upper surfaces of a pair of elastic spring bearing portions 20a and 20b and the support portion 16, a lower surface 31b is secured to the front surface of the extending portion 16a of the support portion 16, and front surfaces 31c and 31e are secured to the support projections 22a and 22b, respectively. Further, a lower surface 31d of the protrusion 30c of the restraint member 30 is secured spanning the upper surface of a mover 18. The restraint member 30 can be secured to the translation mechanism 14 with an adhesive or by means of the viscosity of the viscoelastic body 32 itself. Alternatively, the restraint member and translation mechanism may be mechanically connected using screws or the like.

Other configurations of the actuator 10 are the same as those of the above-described third embodiment, and a detailed description thereof is omitted.

According to the fourth embodiment, the viscoelastic body 32 and restraint member 30 are secured spanning the upper surface of the mover 18, the respective rear surfaces of the support projections 22a and 22b, and the front surface of the extending portion of the support portion 16, so that the mover and elastic spring bearing portions can be kept from vibrating. In this way, an effect of reducing the amplitude of a resonance peak can be obtained without damaging inherent properties of the actuator 10, such as the maximum displacement, main resonant frequency, and translational motion. Also for other points, the same functions and effects as those of the third embodiment can be obtained from the fourth embodiment.

Figure 14:
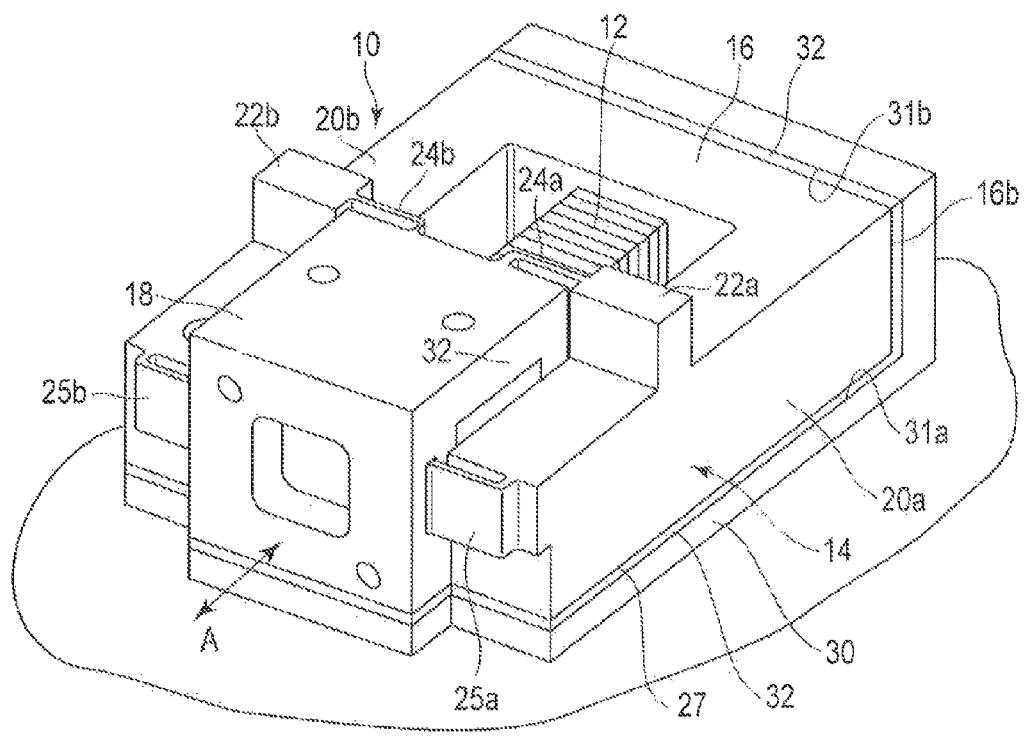
FIG. 14 is a perspective view showing an actuator according to a second modification.
Figure 15:
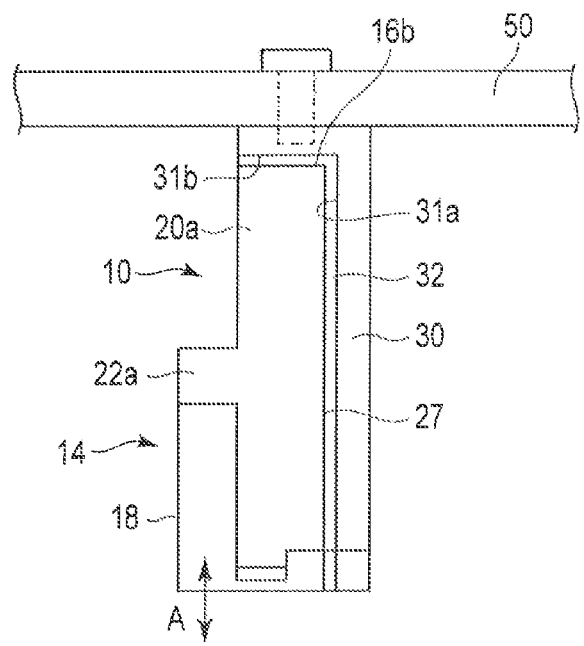
FIG. 15 is a side view showing another example of installation of the actuator of the second modification.

In the fourth embodiment described above, the damping mechanism including the restraint member is provided on the upper surface of the translation mechanism. Alternatively, however, the damping mechanism may be provided spanning the lower surface (bottom surface) of the translation mechanism 14. FIG. 14 shows an actuator according to a second modification.

According to the second modification, the restraint member 30 is secured with the elastic or viscoelastic body 32 applied to or sandwiched between a bottom surface 27 of the translation mechanism 14 and an installation surface and spans the mover 18 and support portion 16. Specifically, the restraint member 30 is an L-shaped angle plate made of a material more stiff than the elastic or viscoelastic body, such as ceramic or metal (for example, aluminum alloy, stainless steel, etc.), and doubles as a fixing member for the entire actuator. The principal surface 31a of the restraint member 30 is secured spanning the respective lower surfaces of the pair of elastic spring bearing portions 20a and 20b and the support portion 16 and the lower surface of the mover 18. The lower surface 31b of the restraint member 30 perpendicular to the principal surface 31a is secured to the lower surface (rear surface) of the support portion 16 with the elastic or viscoelastic body 32 therebetween. With this arrangement, the secured restraint member 30 itself can be used as an installation surface, and the damping effect of the translation mechanism 14 can be increased.

Further, a damping mechanism similar to that of the above-described fourth embodiment can be additionally provided on the upper surface side of the translation mechanism 14. In this case, the damping effect can be doubled.

The actuator 10 constructed in this manner is not limited to the horizontal installation, and may alternatively be used to be suspended in the direction of gravity with the rear surface portion of the restraint member 30 secured and supported on a horizontal installation portion 50.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

In the first and second embodiments, for example, the same functions and effects as those described above can be obtained even in the case where the viscoelastic body is replaced with an elastic body or other material whose internal strain is converted into thermal energy. In connection with the above-described embodiments, the structure in which the elastic or viscoelastic body is interposed between the movable part of the actuator and the restraint member has mainly been described. However, it is important only that a mechanical section is bound with a damping capacity so that an unexpected operation mode (resonance peak other than the main resonance) is suppressed without reducing the stiffness of the actuator, while only the amplitude of the peak of the main resonance is considerably reduced without changing the maximum displacement or resonant frequency. Thus, the material for the damping effect is not limited to the above-described embodiments, and for example, the restraint member itself with a damping capacity can be directly secured to the movable part of the actuator by screws or the like.

The restraint member and the elastic or viscoelastic body are not limited to an L-shape, U-shape, prismatic shape, or rectangular-block shape, and may be of another shape having at least two surfaces. If the movable part and support portion (fixed portion) are bridged to each other, the restraint member may be formed into a structure with only a single surface free of buckling. The elastic or viscoelastic body need not always be provided covering the entire surface of the restraint member, and may be formed narrower than the restraint member. Further, the movable part of the translation mechanism of the actuator may be variously configured, provided that it can move straight as the piezoelectric element is displaced. The piezoelectric element is not limited to the laminated type and may be a piezoelectric element of another type, magnetostrictor, or other drive element having the same characteristics (including production of high thrust, high resonant frequency of the single element, and production of relatively minute displacement).

What is claimed is:

1. A method of damping an actuator to reduce an amplitude of a resonance peak of the actuator, which comprises a piezoelectric element and a translation mechanism comprising a movable part, which is displaced as the piezoelectric element is displaced, and configured to directly transmit the displacement of the piezoelectric element as a rectilinear motion, the method comprising:
   securing one surface of a restraint member having at least two surfaces to the movable part with an elastic or viscoelastic body therebetween;
   securing the other surface of the restraint member to a support portion of the translation mechanism with an elastic or viscoelastic body therebetween; and
   converting vibration energy of the movable part into thermal energy, based on distortion caused by deformation of the elastic or viscoelastic body, to reduce the amplitude of the resonance peak of the actuator.

2. The method of claim 1, wherein the translation mechanism comprises a support portion to which the piezoelectric element is secured and a pair of elastic spring bearing portions extending from the support portion in a direction parallel to a direction of displacement of the piezoelectric element and opposed to each other with a gap therebetween, and the movable part comprises a mover opposed to the support portion with a gap therebetween and secured to the piezoelectric element and spring portions of the elastic spring bearing portions supporting the movable part for linear motion parallel to the direction of displacement of the piezoelectric element; and
   which further comprises securing one of surfaces of the restraint member to the mover with the elastic or viscoelastic body therebetween, and securing the other of the surfaces to the support portion with an elastic or viscoelastic body therebetween.

3. The method of claim 1, wherein the translation mechanism comprises a support portion to which the piezoelectric element is secured and a pair of elastic spring bearing portions extending from the support portion in a direction parallel to a direction of displacement of the piezoelectric element and opposed to each other with a gap therebetween, and the movable part comprises a mover opposed to the support portion with a gap therebetween and secured to the piezoelectric element and spring portions of the elastic spring bearing portions supporting the movable part for linear motion parallel to the direction of displacement of the piezoelectric element; and
   which further comprises securing the one surface of the restraint member to respective side surfaces of the mover and the elastic spring bearing portions with the elastic or viscoelastic body therebetween, and securing the other surface to the support portion with the elastic or viscoelastic body therebetween.

4. The method of claim 1, wherein the translation mechanism comprises the support portion to which the piezoelectric element is secured and a pair of elastic spring bearing portions extending from the support portion in a direction parallel to the direction of displacement of the piezoelectric element and opposed to each other with a gap therebetween, and the movable part comprises a mover opposed to the support portion with a gap therebetween and secured to the piezoelectric element and spring portions of the elastic spring bearing portions supporting the movable part for linear motion parallel to the direction of displacement of the piezoelectric element; and
   which further comprises securing the one surface of the restraint member to respective front surfaces of the mover and the pair of elastic spring bearing portions with the elastic or viscoelastic body therebetween, and securing the other surface to the support portion with the elastic or viscoelastic body therebetween.

5. The method of claim 1, wherein the translation mechanism comprises a support portion to which the piezoelectric element is secured and a pair of elastic spring bearing portions extending from the support portion in a direction parallel to a direction of displacement of the piezoelectric element and opposed to each other with a gap therebetween, and the movable part comprises a mover opposed to the support portion with a gap therebetween and secured to the piezoelectric element and spring portions of the elastic spring bearing portions supporting the movable part for linear motion parallel to the direction of displacement of the piezoelectric element, the restraint member being prismatic; and
   which further comprises securing the one surface of the restraint member to the mover with the elastic or viscoelastic body therebetween, and securing the other surface or two surfaces of the restraint member to the elastic spring bearing portions with the elastic or viscoelastic body therebetween.

6. The method of claim 1, wherein the translation mechanism comprises a support portion to which the piezoelectric element is secured and a pair of elastic spring bearing portions extending from the support portion in a direction parallel to the direction of displacement of the piezoelectric element and opposed to each other with a gap therebetween, and the movable part comprises a mover opposed to the support portion with a gap therebetween and secured to the piezoelectric element and spring portions of the elastic spring bearing portions supporting the movable part for linear motion parallel to the direction of displacement of the piezoelectric element; and which further comprises securing the one surface of the restraint member to respective upper surfaces of the mover and the pair of elastic spring bearing portions with the elastic or viscoelastic body therebetween, and securing the other surface or two surfaces of the restraint member to the support portion and the elastic spring bearing portions with the elastic or viscoelastic body therebetween.

7. The method of claim 1, wherein the restraint member is formed of a metal or ceramic more stiff than the elastic or viscoelastic body and serves to increase the mechanical stiffness of the actuator and suppress motions other than a translational motion.

8. An actuator comprising:
a piezoelectric element;
a translation mechanism comprising a movable part configured to displace as the piezoelectric element is displaced, and configured to directly transmit the displacement of the piezoelectric element as a rectilinear motion; and
a restraint member comprising at least two surfaces, one and the other of which are secured to the movable part and a support portion of the translation mechanism with an elastic or viscoelastic body therebetween, and configured to convert vibration energy of the movable part into thermal energy, based on distortion caused by deformation of the elastic or viscoelastic body to reduce an amplitude of a resonance peak of the actuator.

9. The actuator of claim 8, wherein the translation mechanism comprises the support portion to which the piezoelectric element is secured and a pair of elastic spring bearing portions extending from the support portion in a direction parallel to a direction of displacement of the piezoelectric element and opposed to each other with a gap therebetween, and the movable part comprises a mover opposed to the support portion with a gap therebetween and secured to the piezoelectric element and spring portions of the elastic spring bearing portions supporting the movable part for linear motion parallel to the direction of displacement of the piezoelectric element, the one surface of the restraint member is secured to the mover with the elastic or viscoelastic body therebetween, and the other surface of the restraint member is secured to the support portion with the elastic or viscoelastic body therebetween.

10. The actuator of claim 8, wherein the translation mechanism comprises the support portion to which the piezoelectric element is secured and a pair of elastic spring bearing portions extending from the support portion in a direction parallel to the direction of displacement of the piezoelectric element and opposed to each other with a gap therebetween, and the movable part comprises a mover opposed to the support portion with a gap therebetween and secured to the piezoelectric element and spring portions of the elastic spring bearing portions supporting the movable part for linear motion parallel to a direction of displacement of the piezoelectric element, the one surface of the restraint member is secured spanning respective side surfaces of the mover and the elastic spring bearing portions with the elastic or viscoelastic body therebetween, and the other surface of the restraint member is secured to the support portion with the elastic or viscoelastic body therebetween.

11. The actuator of claim 8, wherein the translation mechanism comprises the support portion to which the piezoelectric element is secured and a pair of elastic spring bearing portions extending from the support portion in a direction parallel to the direction of displacement of the piezoelectric element and opposed to each other with a gap therebetween, and the movable part comprises a mover opposed to the support portion with a gap therebetween and secured to the piezoelectric element and spring portions of the elastic spring bearing portions supporting the movable part for linear motion parallel to a direction of displacement of the piezoelectric element, the one surface of the restraint member is secured spanning respective front surfaces of the mover and the elastic spring bearing portions with the elastic or viscoelastic body therebetween, and the other surface of the restraint member is secured to the support portion with the elastic or viscoelastic body therebetween.

12. The actuator of claim 8, wherein the translation mechanism comprises the support portion to which the piezoelectric element is secured and a pair of elastic spring bearing portions extending from the support portion in a direction parallel to the direction of displacement of the piezoelectric element and opposed to each other with a gap therebetween, and the movable part comprises a mover opposed to the support portion with a gap therebetween and secured to the piezoelectric element and spring portions of the elastic spring bearing portions supporting the movable part for linear motion parallel to the direction of displacement of the piezoelectric element, the restraint member being prismatic, the one surface of the restraint member is secured to the mover with the elastic or viscoelastic body therebetween, and the other surface or the two surfaces of the restraint member are secured to the elastic spring bearing portions with the elastic or viscoelastic body therebetween.

13. The actuator of claim 8, wherein the translation mechanism comprises the support portion to which the piezoelectric element is secured and a pair of elastic spring bearing portions extending from the support portion in a direction parallel to the direction of displacement of the piezoelectric element and opposed to each other with a gap therebetween, and the movable part comprises a mover opposed to the support portion with a gap therebetween and secured to the piezoelectric element and spring portions of the elastic spring bearing portions supporting the movable part for linear motion parallel to a direction of displacement of the piezoelectric element, the one surface of the restraint member is secured spanning the respective upper surfaces of the mover and the pair of elastic spring bearing portions with the elastic or viscoelastic body therebetween, and the other surface or the two surfaces of the restraint member are secured to the support portion and the elastic spring bearing portions with the elastic or viscoelastic body therebetween.

14. The actuator of claim 8, wherein the restraint member is formed of a material and with a shape more stiff than the elastic or viscoelastic body.

* * * * *